United States Patent
Ezhilvalavan et al.

(10) Patent No.: US 7,298,018 B2
(45) Date of Patent: Nov. 20, 2007

(54) PLT/PZT FERROELECTRIC STRUCTURE

(75) Inventors: Santhiagu Ezhilvalavan, Singapore (SG); Victor D. Samper, Springdale (SG)

(73) Assignee: Agency For Science, Technology and Research, Centros (SG)

( * ) Notice: Subject to any disclaimer, the term of this patent is extended or adjusted under 35 U.S.C. 154(b) by 5 days.

(21) Appl. No.: 11/002,383

(22) Filed: Dec. 2, 2004

(65) Prior Publication Data

US 2006/0118840 A1 Jun. 8, 2006

(51) Int. Cl.
*H01L 27/10* (2006.01)

(52) U.S. Cl. ............ 257/532; 257/516; 257/310; 257/295; 438/3

(58) Field of Classification Search ............ 257/310, 257/295, 516, 532, E27.071; 438/3
See application file for complete search history.

(56) References Cited

U.S. PATENT DOCUMENTS

| | | | | |
|---|---|---|---|---|
| 5,612,560 | A * | 3/1997 | Chivukula et al. | 257/309 |
| 5,998,236 | A | 12/1999 | Roeder et al. | |
| 6,903,491 | B2 * | 6/2005 | Irie et al. | 310/328 |
| 6,969,157 | B2 * | 11/2005 | Tomozawa et al. | 347/68 |
| 2002/0063271 | A1 * | 5/2002 | Kim | 257/295 |
| 2004/0155272 | A1 * | 8/2004 | Shin et al. | 257/295 |
| 2004/0195603 | A1 * | 10/2004 | Ito | 257/295 |

OTHER PUBLICATIONS

Dey et al. "Advances in Processing and Properties of Perovskite Thin-Films for FRAMs, DRAMs, and Decoupling Capacitors", Integrated Ferroelectrics, 1992, vol. 1.
Patel et al. "Ferroelectric Thin Films for Integrated Sensor and Memory Devices", GEC Journal of Research, vol. 12, No. 3, 1995.
Nakao et al. "Study on Pb-Based Ferroelectric Thin Films Prepared by Sol-Gel Mehtod for Memory Application", Jpn. J. Appl. Phys., vol. 33, 1994.

* cited by examiner

*Primary Examiner*—Evan Pert
*Assistant Examiner*—Victor A. Mandala, Jr.
(74) *Attorney, Agent, or Firm*—Barnes & Thornburg LLP

(57) ABSTRACT

An electrically stable $PbLa_{0.5}TiO_3/PbZr_{0.52}Ti_{0.48}O_3$ (PLT/PZT) ferroelectric structure may fabricated using precursor solutions formed using a simple sol-gel process. The PLT/PZT ferroelectric structure may be extended to a PLT/PZT/PLT ferroelectric capacitor structure. In terms of device application, better ferroelectric properties with reliable fatigue characteristics are desirable to render satisfactory performance and long device life. The PLT/PZT/PLT ferroelectric capacitor structure excels over previous hybrid structures by providing a larger remnant polarization, higher saturation polarization, lower coercive field and leakage current density and higher resistance to fatigue. The fabrication method involving the use of a PLT seeding layer acts to lower the fabrication temperature of the subsequent PZT layer and allows for a simpler sequence of processing steps that may be seen to substantially reduce manufacturing costs.

30 Claims, 13 Drawing Sheets

PLT/PZT FERROELECTRIC STRUCTURE

FIELD OF THE INVENTION

The present invention relates to ferroelectric structures useful in fabricating capacitors wherein a ferroelectric film separates a Lead Zirconate Titanate film from an associated electrode.

BACKGROUND

Ferroelectric thin films of $Pb(Zr_xTi_{1-x})O_3$ (lead zirconate titanate or "PZT") are being developed for next generation electronic devices such as non-volatile and optical memories, micro switches, micro-actuators, micro-positioners, micro sensors, energy generators, etc. The progress made in fabricating high quality PZT films has opened a new area for applications in biomedical devices, especially the possible integration of high quality PZT films with silicon technology. The growth of PZT thin films has been realized by various methods; a method known as the "sol-gel" method is likely to be a dominant growth technique because the sol-gel method is a simple process that meets device fabrication requirements, such as relatively low processing temperature, large area coating ability and ease of composition control (see R. W. Schwartz, J. A. Voigt, B. A. Tuttle, D. A. Payne, T. L. Reichert and R. S. DaSalla, "Comments on the effects of solution precursor characteristics and thermal processing conditions on the crystallization behavior of sol-gel derived PZT thin films," J. Mater. Res., Vol. 12, no. 2, February 1997, pp. 444).

When promoting the fabrication of a PZT film on a silicon (Si) substrate, which involves coating with a precursor solution and subsequent annealing, it is known to be important to control the formation of a desirable phase in the PZT film, called the "perovskite phase". It is known that the diffusion of lead (Pb) from the PZT film to the substrate occurs during the annealing of the PZT and can easily induce the formation of an undesirable phase in the PZT film, called the "pyrochlore phase", at the PZT film/substrate interface (see R. A. Roy, K. F. Etzold, "Substrate and temperature effects in lead zirconate titanate films produced by facing targets sputtering," J. Mater. Res. Vol. 7, no. 6, June 1992, pp. 1455).

High temperature processing can also cause lead volatilization, which has been shown to result in the formation of undesirable PZT phase and microstructure. For instance, conventional 2-methoxyethanol derived PZT film without any seeding layer has been shown to result in a "rosette" microstructure with micron size non-uniform grains (see J. Lee, C. Kim, D. Yoon, C. Choi, J. Kim, K. No, Jpn. J. Appi. Phys. 33 (1994) 260 and C. Kwok, S. B. Desu, "Low temperature perovskite formation of lead zirconate titanate thin films by a seeding process," J. Mater. Res., vol. 8, no. 2, February 1993, 339). The undesirable PZT phase and microstructure have been shown to degrade the electrical properties of the PZT film (see K. Sreenivas, I. Reaney, T. Maeder and N. Setter, "Investigation of Pt/Ti bilayer metallization on silicon for ferroelectric thin film integration," J. Appl. Phys., Vol. 75 (1994), 232-239).

The challenge of integrating PZT films with a silicon substrate is primarily the development of a PZT fabrication process compatible with the silicon without significant formation of the undesirable phase.

More recently, studies have been performed to reduce the processing temperature and improve the ferroelectric properties of the films fabricated using the sol-gel method. Kwok and Desu presented a novel PZT deposition method to include a lead titanate ($PbTiO_3$ or "PT") seeding layer between the PZT film and a substrate. This seeding layer can offer nucleation sites (i.e., locations where the conditions for the formation of crystals, is favorable) and reduce the activation energy for crystallization of PZT thin films, thereby lowering the perovskite formation temperature (see C. Kwok, S. B. Desu, "Low temperature perovskite formation of lead zirconate titanate thin films by a seeding process," J. Mater. Res., vol. 8, no. 2, February 1993, 339). The perovskite formation temperature of PZT alone is known to be about 900° C., while the perovskite transformation temperature of a PZT/PT structure is only 750° C. (see U.S. Pat. No. 6,507,060 to Ren et al.). Ren et al. have also demonstrated that PT/PZT/PT structures can be formed at a much lower processing temperature of around 600-700° C. (see T. L. Ren, L. T. Zhang, L. T. Liu and Z. J. Li, "Electrical properties of a silicon-based PT/PZT/PT sandwich structure," J. Phys. D: Appl. Phys., Volume 33, Number 15, 7 August 2000, L77).

The use of conductive oxide electrodes that can easily adhere to $SiO_2$/Si substrates without the need for additional adhesion layers can also be shown to provide excellent resistance to polarization fatigue (Y. K. Wang, T. Y. Tseng and P. Lin, "Enhanced ferroelectric properties of $Pb(Zr_{0.53}Ti_{0.47})O_3$ thin films on $SrRuO_3$/Ru/$SiO_2$/Si substrates," Appl. Phys. Lett., Vol. 80, Issue 20, pp. 3790, May 20, 2002). However, the results reveal that the conductive oxide electrodes lead to a large increase in leakage current and an increased susceptibility to early dielectric breakdown when compared with the use of platinum electrodes. Kim et al. reported the effects of a PT layer on Pt/$RuO_2$ hybrid electrodes and showed control of the second phase ($Pb_2Ru_2O_{7-x}$) with improved ferroelectric properties (S. H. Kim, Y. S. Choi, C. E. Kim, D. Y. Yang, "The effects of $PbTiO_3$ thin template layer and Pt/$RuO_2$ hybrid electrode on the ferroelectric properties of sol-gel derived PZT thin film," Thin Solid Films, vol. 325, issue 1, pp. 72-78, 18 July 1998).

While some gains have been made, further reductions in the processing temperature and further improvements in the ferroelectric properties of PZT film structures may be seen as beneficial.

SUMMARY

A Lanthanum doped Lead Titanate (PLT) layer may be used as a seeding layer between a Lead Zirconate Titanate (PZT) layer and an associated electrode. As such, a silicon-based PLT/PZT/PLT sandwich structure may be fabricated, whose thermal budget and cost of fabrication are substantially reduced and the ferroelectric properties are improved relative to known PZT sandwich structures. Advantageously, relative to the known PZT sandwich structures, processing temperatures are reduced, density of oxygen vacancies in the PZT layer is reduced and polarization fatigue properties are improved.

In accordance with an aspect of the present invention there is provided a ferroelectric structure. The ferroelectric structure includes a Lanthanum doped Lead Titanate layer and a Lead Zirconate Titanate layer formed over the Lanthanum doped Lead Titanate layer.

In accordance with another aspect of the present invention there is provided a method for fabricating a ferroelectric structure. The method includes forming a Lanthanum doped Lead Titanate layer and forming a Lead Zirconate Titanate layer over the Lanthanum doped Lead Titanate layer.

In accordance with still another aspect of the present invention there is provided a structure for a PLT/PZT ferroelectric capacitor. The structure includes: a substrate; a dielectric layer formed over the substrate; a first conductive metal film formed over the dielectric layer; a second conductive metal film formed over the first conductive metal film; a Lanthanum doped Lead Titanate layer formed over the second conductive metal film; a Lead Zirconate Titanate layer formed over the Lanthanum doped Lead Titanate layer; and a third conductive metal film formed over the Lead Zirconate Titanate layer.

In accordance with a further aspect of the present invention there is provided a structure for a PLT/PZT/PLT ferroelectric capacitor. The structure includes: a substrate; a dielectric layer formed over the substrate; a first conductive metal film formed over the dielectric layer; a second conductive metal film formed over the first conductive metal film; a first Lanthanum doped Lead Titanate layer formed over the second conductive metal film; a Lead Zirconate Titanate layer formed over the first Lanthanum doped Lead Titanate layer; a second Lanthanum doped Lead Titanate layer formed over the Lead Zirconate Titanate layer; and a third conductive metal film formed over the second Lanthanum doped Lead Titanate layer.

In accordance with a still further aspect of the present invention there is provided a method for fabricating a PLT/PZT ferroelectric capacitor on a substrate. The method includes: forming a dielectric layer over the substrate; forming a first conductive film over the dielectric layer; forming a second conductive film over the first conductive film; forming a Lanthanum doped Lead Titanate layer over the second conductive film; forming a Lead Zirconate Titanate layer over the Lanthanum doped Lead Titanate layer; forming a third conductive film over the Lead Zirconate Titanate layer.

In accordance with a still further aspect of the present invention there is provided a method for fabricating a PLT/PZT/PLT ferroelectric capacitor on a substrate. The method includes: forming a dielectric layer over the substrate; forming a first conductive film over the dielectric layer; forming a second conductive film over the first conductive film; forming a first Lanthanum doped Lead Titanate layer over the second conductive film; forming a Lead Zirconate Titanate layer over the first Lanthanum doped Lead Titanate layer; forming a second first Lanthanum doped Lead Titanate layer over the Lead Zirconate Titanate layer; and forming a third conductive film over the second Lanthanum doped Lead Titanate layer.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate example embodiments of this invention.

DETAILED DESCRIPTION

Figure 1:
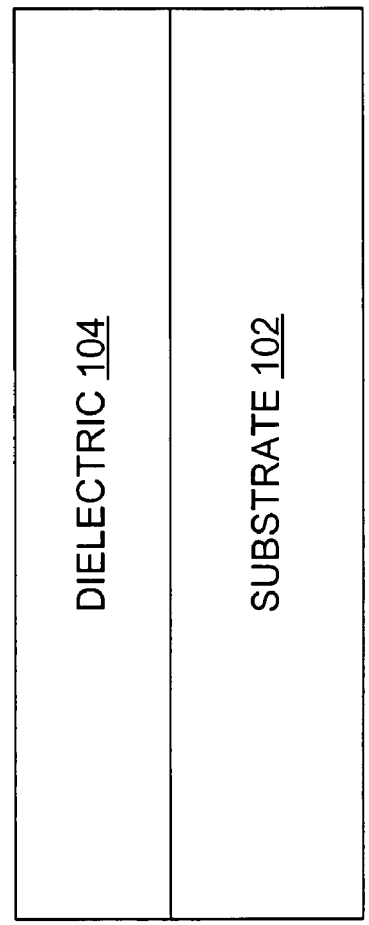
FIG. 1 illustrates a schematic cross sectional representation of a substrate on which is formed a dielectric layer.

FIG. 1 illustrates a first phase substrate 100 based on a substrate 102. The semiconductor substrate 102 may be made of silicon material. When fabricating the first phase substrate 100, a dielectric layer 104 is formed over the semiconductor substrate 102. The dielectric layer 104 may be made of silicon dioxide material formed by performing a conventional deposition technique such as a thermal oxidation. The thickness of the dielectric layer 104 may be within a range of about 0.1-2.0 µm (layers are not illustrated to scale).

The substrate 102 may be considered to function mainly as a support, without a role to play in the electrical properties of the eventually formed ferroelectric structure. However, the surface conditions (roughness) of the substrate 102 may be considered very important to the adhesion of the dielectric layer 104 and the successive conductive films.

Additionally, the substrate 102 should be selected to withstand the processing temperatures necessary to the correct formation (nucleation and growth) of the ferroelectric structure. The correctness of the nucleation and growth ferroelectric structure may be considered to depend primarily on the surface nature of the conductive film on which the ferroelectric structure is formed. As such, the electrical properties of the ferroelectric structure may be shown to be dependent on the surface morphology of the conductive films. While a semiconductor, such as silicon (Si), may be selected for the substrate 102, a polycrystalline or single crystal ceramic may also be selected for the substrate 102. Eligible ceramics include glass, quartz, $SrTiO_3$, $Al_2O_3$, MgO, $RuO_2$ and $SrRuO_3$.

Figure 2:
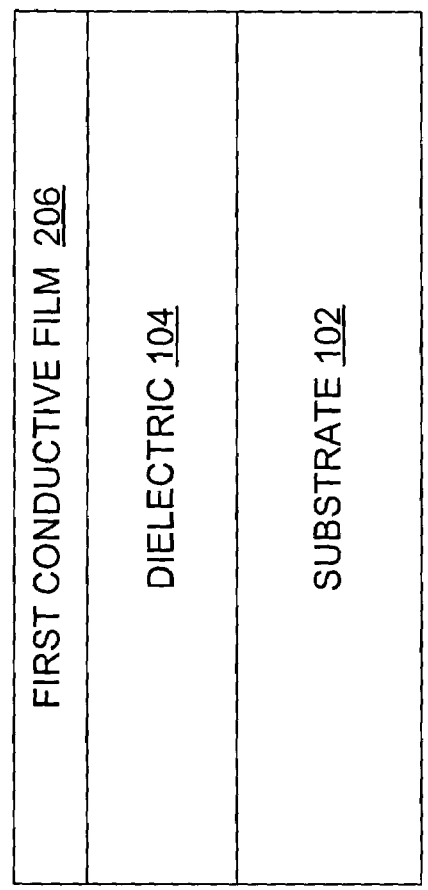
FIG. 2 illustrates a schematic cross sectional representation of the substrate of FIG. 1 with the addition of a conductive film formed on the dielectric layer.

In FIG. 2, a second phase substrate 200 is illustrated to include a thin first conductive film 206, which is formed over the dielectric layer 104. The first conductive film 206 may comprises a titanium (Ti) material. The first conductive film 206 may be formed by electron beam evaporation or sputtering. The thickness of the first conductive film 206 may be around 50 nm.

Figure 3:
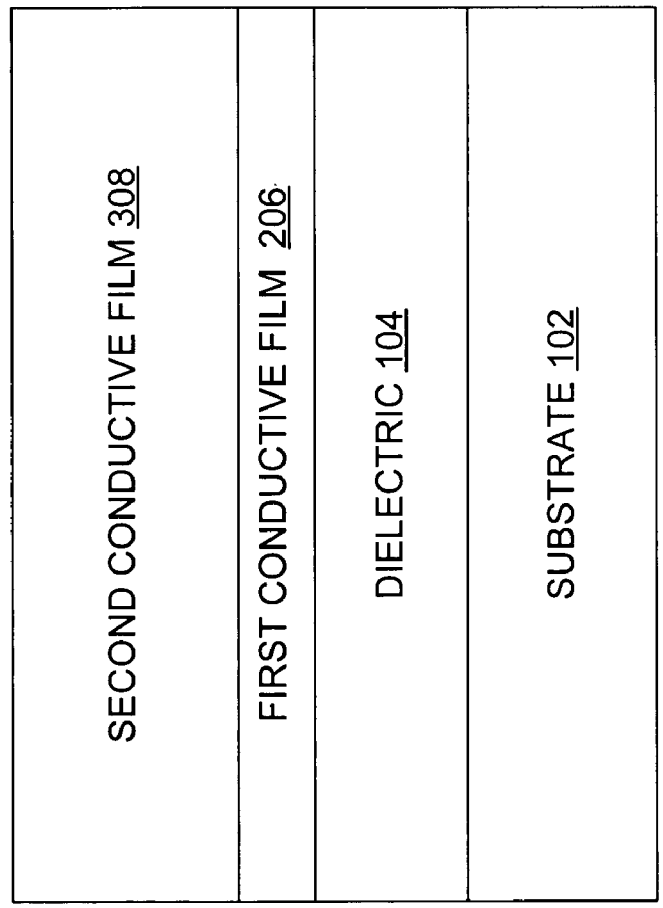
FIG. 3 illustrates a schematic cross sectional representation of the substrate of FIG. 2 with the addition of a second conductive film formed over the first conductive film.
Figure 3:

FIG. 3 illustrates a third phase substrate 300, after a second conductive film 308 has been formed over the first conductive film 206 as a bottom electrode. The second conductive film 308 may comprise a platinum material. The second conductive film 308 may be formed by electron beam evaporation or sputtering. The thickness of the second conductive film 308 may be around 150 nm.

Figure 4:
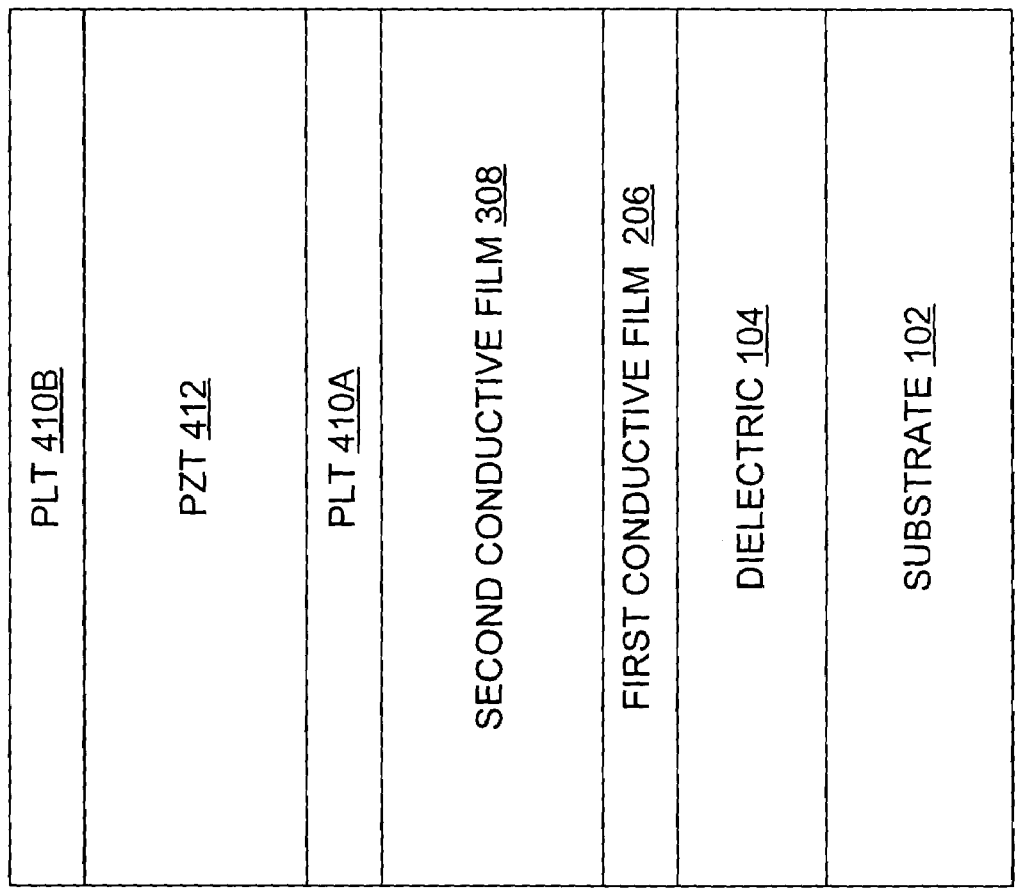
FIG. 4 illustrates a schematic cross sectional representation of the substrate of FIG. 3 with the addition of a PLT/PZT/PLT ferroelectric structure over the second conductive film according to an embodiment of the present invention.
Figure 4:
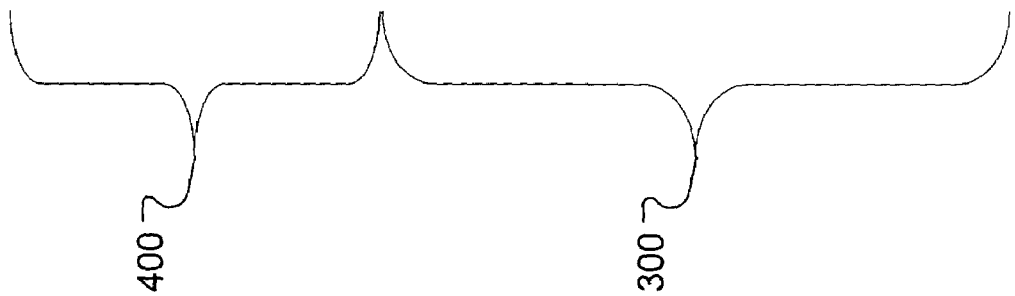

FIG. 4 illustrates the third phase substrate 300 with the addition of a PLT/PZT/PLT ferroelectric capacitor 400. The PLT/PZT/PLT ferroelectric capacitor 400 includes a bottom PLT layer 410A of Lanthanum doped Lead Titanate ($PbLa_{0.5}TiO_3$ or "PLT"), a PZT layer 412 and a top PLT layer 410B.

The bottom PLT layer 410A may be formed on the third phase substrate 300 by spin coating with a PLT precursor solution at 3,000 rpm for 30 seconds. The thickness of the bottom PLT layer 410A may be in the range of 10 to 100 nm, for example, around 50 nm. The PZT layer 412 may be formed on the bottom PLT layer 410A by spin coating a PZT precursor solution at 3,000 rpm for 30 seconds. Valid ranges for such spin coating include 500 to 5,000 rpm and 10 to 100 seconds. The thickness of the PZT layer 412 for a 250 nm thick PLT/PZT/PLT ferroelectric capacitor 400 is around 150 nm. Notably, the thickness of the bottom PLT layer 410A should not exceed 20% of the thickness of the PZT layer 412.

Once the PZT layer 412 has been formed, the combination of the third phase substrate 300, the bottom PLT layer 410A and the PZT layer 412 may be annealed at 700° C. for one hour. It may be shown that annealing may be performed at temperatures ranging from 600° C. to 800° C. for greater than 30 minutes. During the annealing, the bottom PLT layer 410A and the PZT layer 412 are transformed from an amorphous state to a stable, well-crystallized perovskite state.

The top PLT layer 410B may be formed on the PZT layer 412 by spin coating the PLT precursor solution at 3,000 rpm for 30 seconds. The thickness of the top PLT layer 410B may be around 50 nm.

Before spin coating, the PLT precursor solution of 0.4 molar concentration of PLT (5 mol % excess lead) may be prepared by a sol-gel process. The PLT precursor solution may be prepared using lead acetate trihydrate, lanthanum nitrate hexahydrate and tetraisopropyl orthotitanate in 2-methoxyethanol and acetic acid as the solvent (3:1).

Similarly, the PZT precursor solution of 0.4 molar concentration of PZT may be prepared by a sol-gel process. Excess lead may be added to the precursor solution by adding an appropriate wt % of a lead source (e.g., lead acetate trihydrate). Although the addition of 5 to 20 mol % excess lead has been found beneficial, it has been found that the addition of 20 mol % excess lead is optimal. Notably, ferroelectric parameters start decreasing with the appearance of minor secondary phases (Pb-rich) as the excess lead content is increased above 20 mol %.

The excess lead acts to compensate for a loss of lead due to volatilization during the annealing. The annealed PZT layer may have a stoichiometric composition of Pb/(Zr+Ti) around 1.00 with the Zr/Ti ratio of about 52/48. Such a stoichiometric composition may be considered close to a morphotropic PZT composition, which separates into a tetragonal (rich in titanium) perovskite phase and a rhombohedral (rich in zirconium) perovskite phase. This stoichiometric composition is widely used and studied because the composition exhibits optimal dielectric and ferroelectric properties for several applications (see C. A. Paz de Araujo, J. D. Cuchlaro, L. D. McMillan, M. C. Scott and J. F. Scott, "Fatigue-free ferroelectric capacitors with platinum electrodes," Nature (London), Vol. 374, no. 6523, pp. 627-9,13 April 1995 and Landolt-Börnstein, Ferroelectrics and Related Substances (Springer, Berlin, 1981), Group III, 16a, 143). The PZT precursor solution may be prepared using lead acetate trihydrate, zirconium propoxide (70% in n-propanol) and tetraisopropyl orthotitanate in 2-methoxyethanol and acetic acid as the solvent (3:1).

After deposition of the PZT layer 412, which typically provides a layer around 50 nm thick, solvent removal and organic pyrolysis may be accomplished by a heat treatment at around 300° C. for five minutes on a preheated hot plate. More than one layer of PZT may be deposited to prepare an overall thicker PZT layer 412 than would normally be deposited in a single spin coating. Three or four 50 nm thick layers may be deposited to give a 150-200 nm thick layer that is then annealed at 700° C. for one hour in a furnace at a heating rate of 10° C. per minute and then allowed to cool to room temperature inside the furnace. Consequently, to form a 1 µm thick PLT/PZT/PLT ferroelectric capacitor 400, a 900 nm thick PZT layer 412 may formed of 18 layers that are each 50 nm thick.

Figure 5:
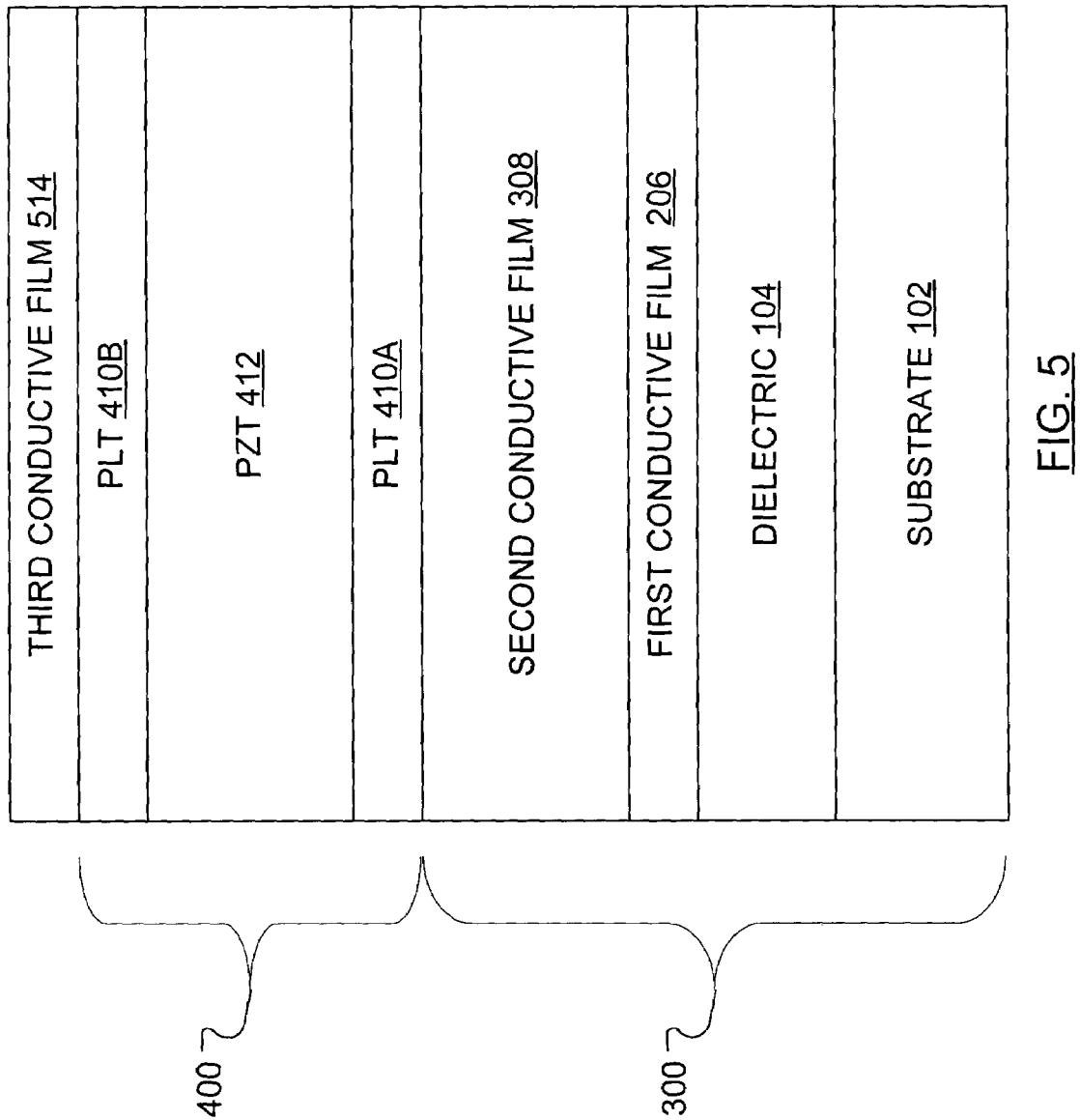
FIG. 5 illustrates the combination substrate and ferroelectric structure of FIG. 4 with the addition of a third conductive film over the PLT/PZT/PLT ferroelectric structure according to an embodiment of the present invention.

FIG. 5 illustrates the combination of the third phase substrate 300 and the PLT/PZT/PLT ferroelectric capacitor 400 after the formation of a third conductive film 514 over the PLT/PZT/PLT ferroelectric capacitor 400 as a top electrode. The third conductive film 514 may comprise a platinum material. The third conductive film 514 may be formed by electron beam evaporation or sputtering through a shadow mask so as to define a planar capacitor structure. The diameter of the third conductive film 514 may be in the range 150-350 µm.

Figure 6:
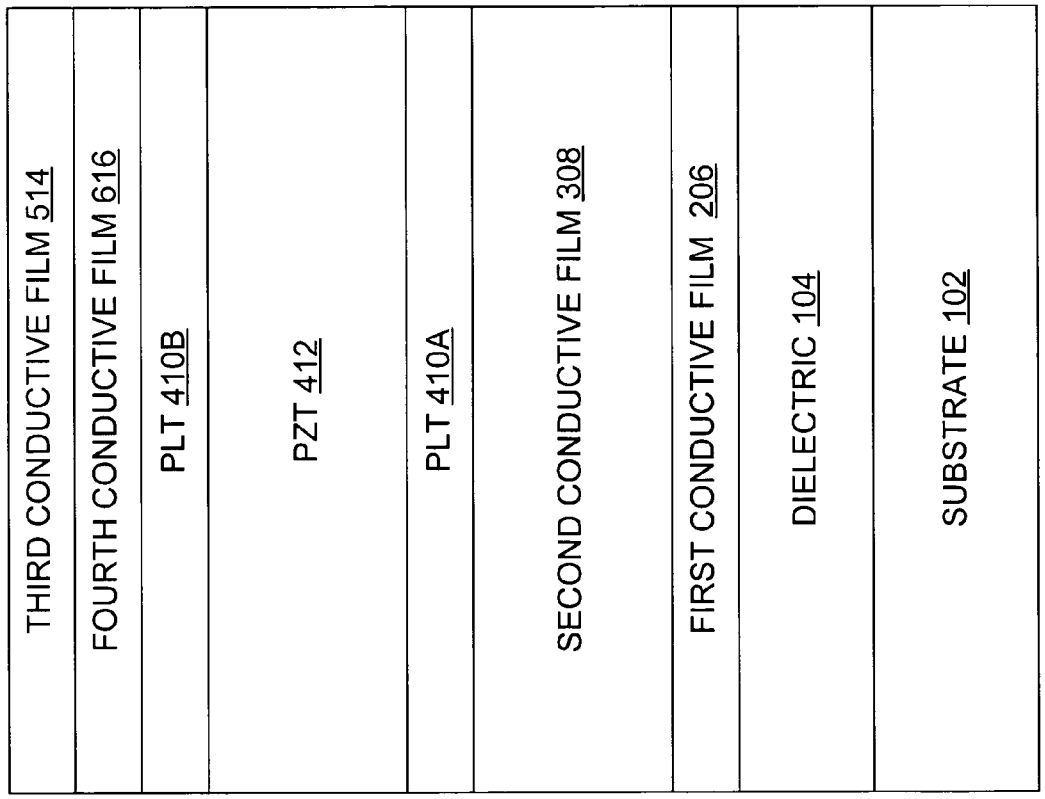
FIG. 6 illustrates the combination substrate and ferroelectric structure of FIG. 5 with the addition of a fourth conductive film over the third conductive film according to an embodiment of the present invention.
Figure 6:
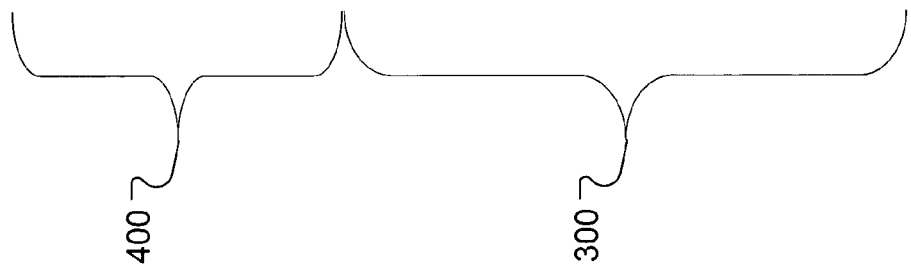

As an alternative to the single layer top electrode of FIG. 5, the top electrode may be formed of two conductive layers, as illustrated in FIG. 6. In which case, a fourth conductive film 616, which may comprise a titanium material, may be formed over the PLT/PZT/PLT ferroelectric capacitor 400 before the formation of the third conductive film 514, which, as stated above, may comprise a platinum material. The presence of the fourth (titanium) conductive film 616 may be shown to enhance the adhesion of the third (platinum) conductive film 514 to the top PLT layer 410B.

In overview, PLT layers 410A, 410B are introduced between the PZT layer 412 and the associated electrodes 308, 514 in a PZT-based ferroelectric capacitor.

Advantageously, the introduction of the PLT layers 410A, 410B can greatly improve the ferroelectric and leakage current characteristics in general, and polarization fatigue properties in particular, when compared to known PZT-based ferroelectric capacitors. The improvement may be attributed to the bottom PLT layer 410A, which may be considered to offer nucleation sites and reduce the activation energy for the crystallization of the PZT layer 412 forming stoichiometric perovskite structures at processing temperatures around 700° C. In addition, the PLT layers 410A, 410B may be seen to help to attain a better interface between the PZT layer 412 and the associated electrodes 308, 514, thereby leading to absorption of oxygen vacancies or other point defects from the PZT layer 412.

Figure 7:
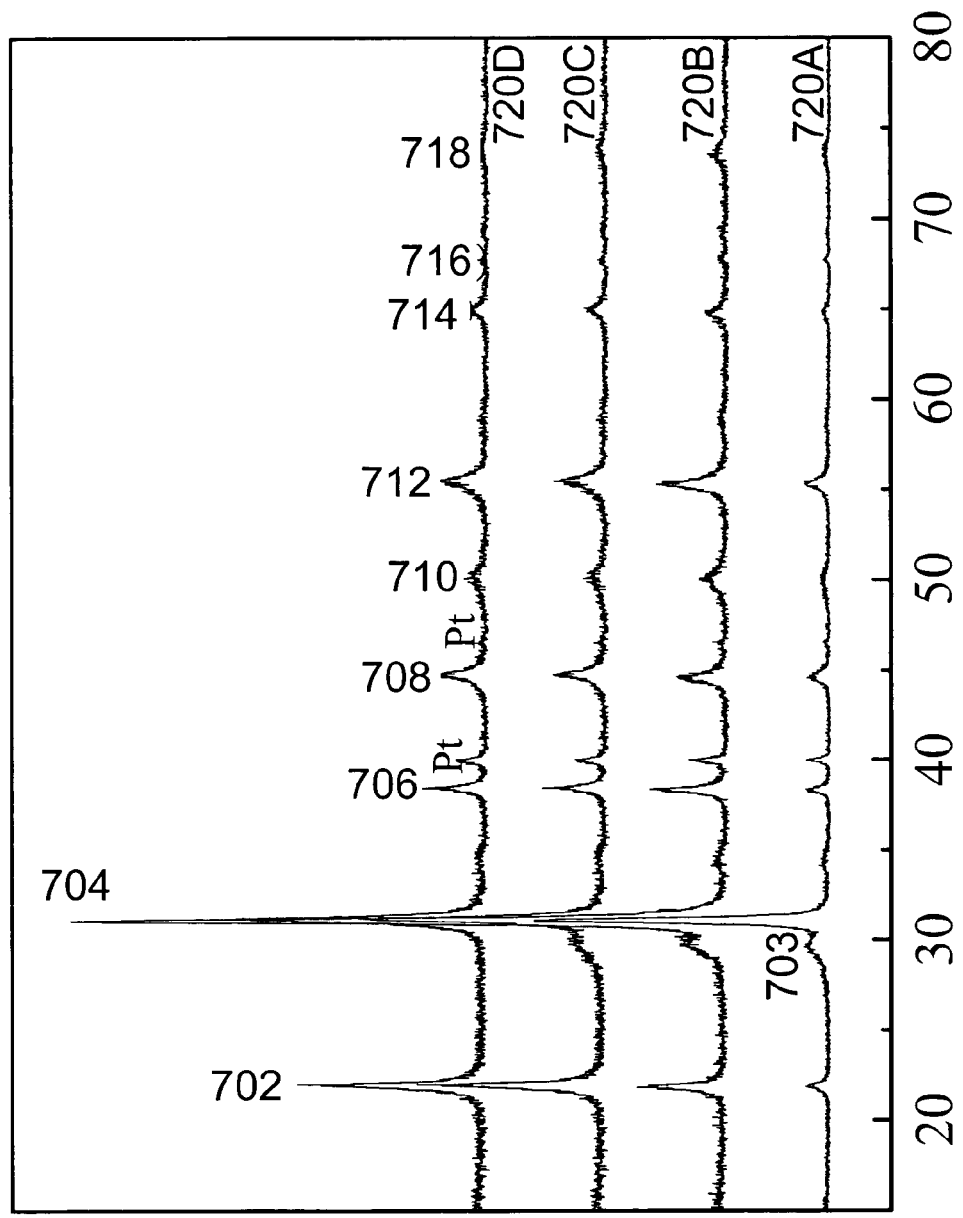
FIG. 7 illustrates a graph showing x-ray diffraction analysis of four PLT/PZT ferroelectric capacitors formed according to an embodiment of the present invention, where each of the four PLT/PZT ferroelectric capacitors corresponds to a PZT layer of a distinct thickness.

X-ray diffraction (XRD) patterns of four embodiments of the PLT/PZT ferroelectric capacitor 400, each of the four PLT/PZT ferroelectric capacitors having a different thickness, are shown in FIG. 7.

A first XRD pattern 720A relates to a 250 nm thick PLT/PZT ferroelectric capacitor formed using a PZT precursor solution having 10 mol % excess lead. A second XRD pattern 720B relates to a 500 nm thick PLT/PZT ferroelectric capacitor formed using a PZT precursor solution having 10 mol % excess lead. A third XRD pattern 720C relates to a 1 μm thick PLT/PZT ferroelectric capacitor formed using a PZT precursor solution having 10 mol % excess lead. A fourth XRD pattern 720D relates to a 1 μm thick PLT/PZT ferroelectric capacitor formed using a PZT precursor solution having 20 mol % excess lead.

The sharp diffraction peaks indicate better homogeneity and crystallization of the films. All the films exhibited perovskite structures with random orientations and dominant peaks at 702 and 704. A small amount of pyrochlore phase was observed, as indicated by the presence of a pyrochlore peak 703 in the first XRD pattern 720A, but the pyrochlore peak 703 becomes weaker as the PZT layer 412 thickness is increased. The quantity of pyrochlore phase is negligibly small (less than 1%) and, hence, the films can be considered as single phase. It can be shown that the presence of the pyrochlore phase can be effectively eliminated by either annealing at a higher temperature (greater than 750° C.) or by increasing the amount of excess lead in the PZT precursor solution to about 20 mol % and annealing at 700° C. for one hour (see the fourth XRD pattern 720D).

In operation, an electric field may be applied to a PLT/PZT/PLT ferroelectric capacitor so that the PLT/PZT/PLT ferroelectric capacitor reaches a saturation polarization. The electric field may then be removed. As a consequence of the application of electric field, the PLT/PZT/PLT ferroelectric capacitor maintains a remnant polarization, that is, the PLT/PZT/PLT ferroelectric capacitor maintains a charge. Thus, the PLT/PZT/PLT ferroelectric capacitor may be used as an element of a memory. Advantageously, the maintenance of the charge does not require electrical power. The charge maintained on the PLT/PZT/PLT ferroelectric capacitor may be reversed through the application of an electric field of equal magnitude and opposite orientation. The maintenance of charge for a given ferroelectric device may be studied through a measurement of a ferroelectric hysteresis loop.

Figure 8:
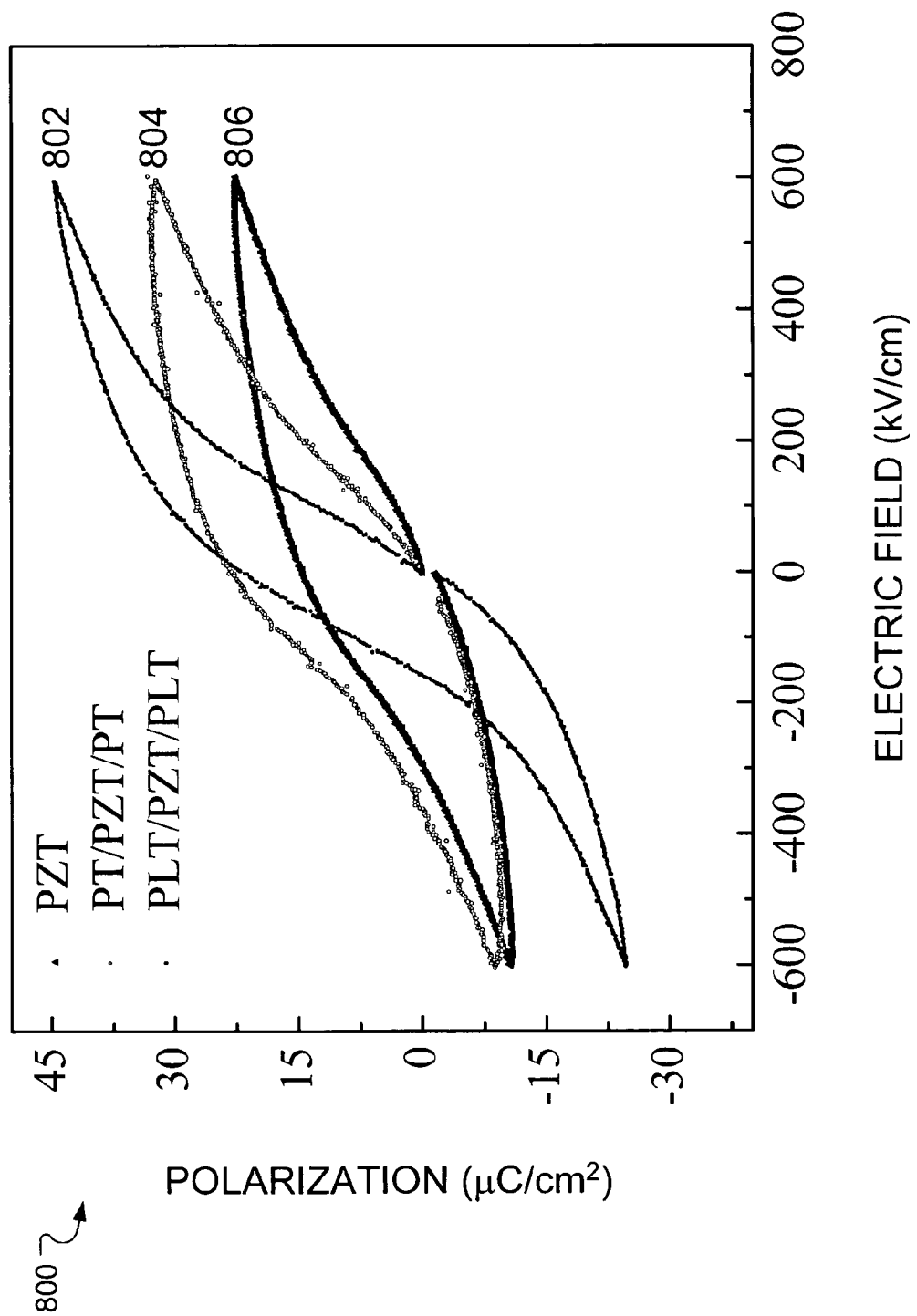
FIG. 8 illustrates a hysteresis loop of a 250 nm thick PLT/PZT/PLT ferroelectric capacitor formed according to an embodiment of the present invention alongside hysteresis loops of prior art 250 nm thick PZT-based ferroelectric capacitors.

The measurement of ferroelectric hysteresis loops may be performed at room temperature and the ferroelectric hysteresis loops may be recorded using a pulse waveform at a frequency of 100 Hz. The ferroelectric hysteresis behavior of a PLT/PZT/PLT ferroelectric capacitor formed according to an embodiment of the present invention with a thickness around 250 nm is illustrated in FIG. 8.

A first hysteresis loop 802 exhibits a remnant polarization ($P_r$), for a 250 nm thick PLT/PZT/PLT ferroelectric capacitor, of 19 μC/cm² and a coercive field ($E_c$) of 60 kV/cm with a saturation polarization ($P_{max}$) of about 45 μC/cm² for an applied electric field of 600 kV/cm. A second hysteresis loop 804 is illustrated for a 250 nm thick PT/PZT/PT ferroelectric capacitor and a third hysteresis loop 806 is illustrated for a 250 nm thick PZT-only ferroelectric capacitor. In comparison to the second hysteresis loop 804 and the third hysteresis loop 806, the first hysteresis loop 802 illustrates that a PLT/PZT/PLT ferroelectric capacitor demonstrates better ferroelectric characteristics than a similarly dimensioned PT/PZT/PT ferroelectric capacitor or PZT-only ferroelectric capacitor.

Figure 9:
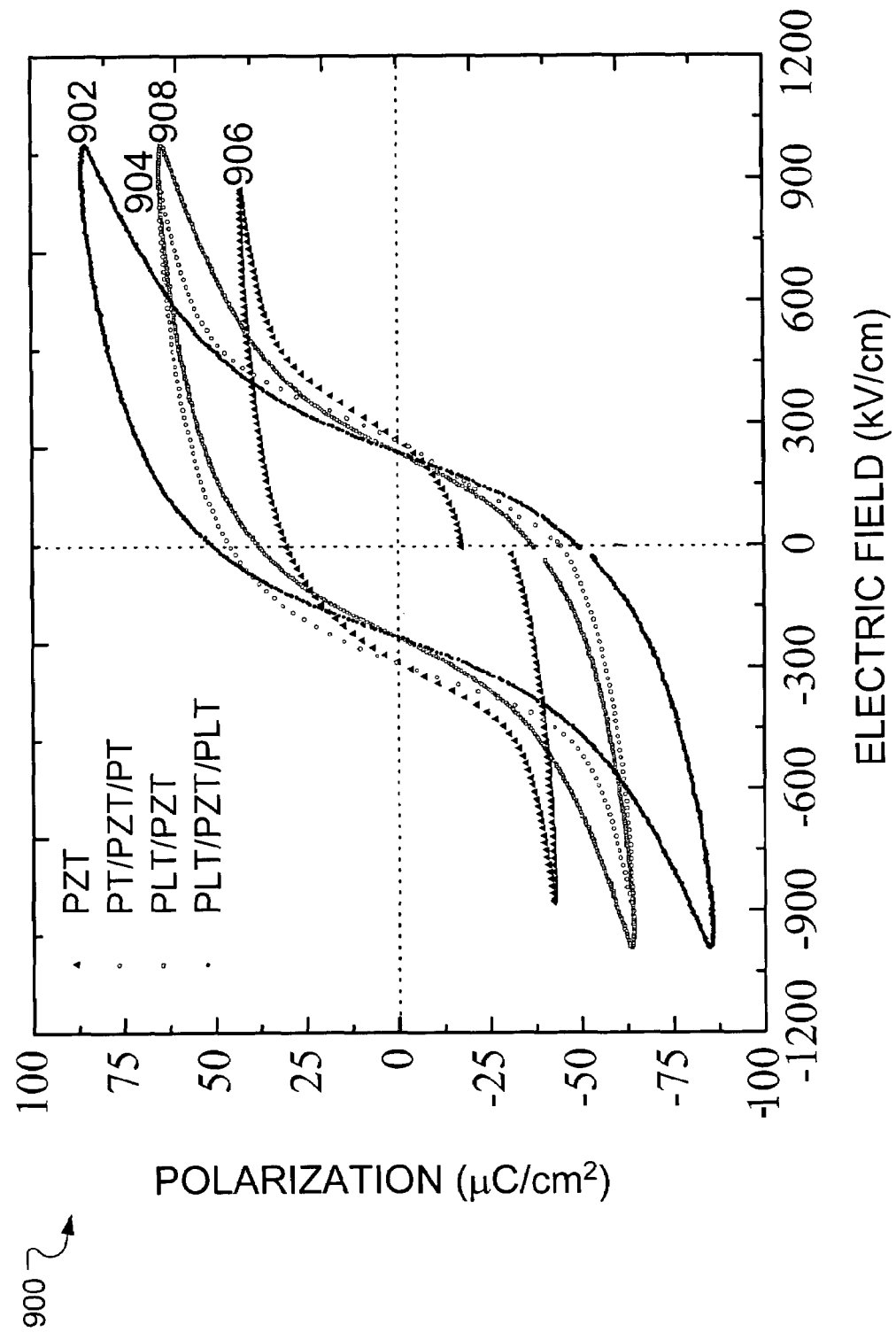
FIG. 9 illustrates a hysteresis loop of a 1 µm thick PLT/PZT/PLT ferroelectric capacitor formed according to an embodiment of the present invention alongside a hysteresis loop of a PLT/PZT ferroelectric structure formed according to an embodiment of the present invention and hysteresis loops of prior art 1 µm thick PZT-based ferroelectric capacitors.

The ferroelectric hysteresis behavior of a 1 μm thick PLT/PZT/PLT ferroelectric capacitor formed according to an embodiment of the present invention is illustrated displayed in FIG. 9. A first hysteresis loop 902 exhibits a $P_{max}$, for the 1 μm thick PLT/PZT/PLT ferroelectric capacitor, of about 85 μC/cm² at an applied electric field of 900 kV/cm with $P_r$ around 50 μC/cm² and $E_c$ around 225 kV/cm.

A second hysteresis loop 904 is illustrated for a 1 μm thick PT/PZT/PT ferroelectric capacitor and a third hysteresis loop 906 is illustrated for a 1 μm thick PZT-only ferroelectric capacitor. Notably, the second hysteresis loop 904 and third hysteresis loop 906 display ferroelectric characteristics corresponding to 1 μm thick PT/PZT/PT and PZT-only ferroelectric capacitors that are better than the ferroelectric characteristics corresponding to 250 μm thick PT/PZT/PT and PZT-only ferroelectric capacitors (in the second hysteresis loop 804 and the third hysteresis loop 806 of FIG. 8). However, the second hysteresis loop 904 and third hysteresis loop 906 are associated with $P_r$ (30 and 45 μC/cm², respectively) and $P_{max}$ (40 and 60 μC/cm², respectively) values that are lower than the $P_r$ (50 μC/cm²) and $P_{max}$ (85 μC/cm²) values for the first hysteresis loop 902 and an $E_c$ (around 275 kV/cm) value that is higher than the $E_c$ value (225 kV/cm) for the first hysteresis loop 902. Notably, high $P_r$ and $P_{max}$ and low $E_c$ are advantageous.

A fourth hysteresis loop 908 is illustrated for a 1 μm thick PLT/PZT ferroelectric capacitor. For comparison the other hysteresis loops 902, 904, 906, the fourth hysteresis loop 908 exhibits a $P_r$ of 38 μC/cm², a $P_{max}$ of 63 μC/cm² and an $E_c$ around 235 kV/cm.

It is also worth noting that the PLT/PZT/PLT ferroelectric capacitor exhibits symmetric hysteresis loops when the capacitor thickness is around 250 nm (represented by the first hysteresis loop 802 in FIG. 8) and maintains the symmetry at higher thicknesses, around 1 μm (represented by the first hysteresis loop 902 in FIG. 9). This indicates that thicker PLT/PZT/PLT ferroelectric capacitors show improved polarization, in comparison to PT/PLT/PT and PZT-only ferroelectric capacitors, when the applied electric field is strong enough to switch the domains along the field direction, i.e., it may be considered that thicker capacitors behave like bulk ferroelectrics.

Figure 10:
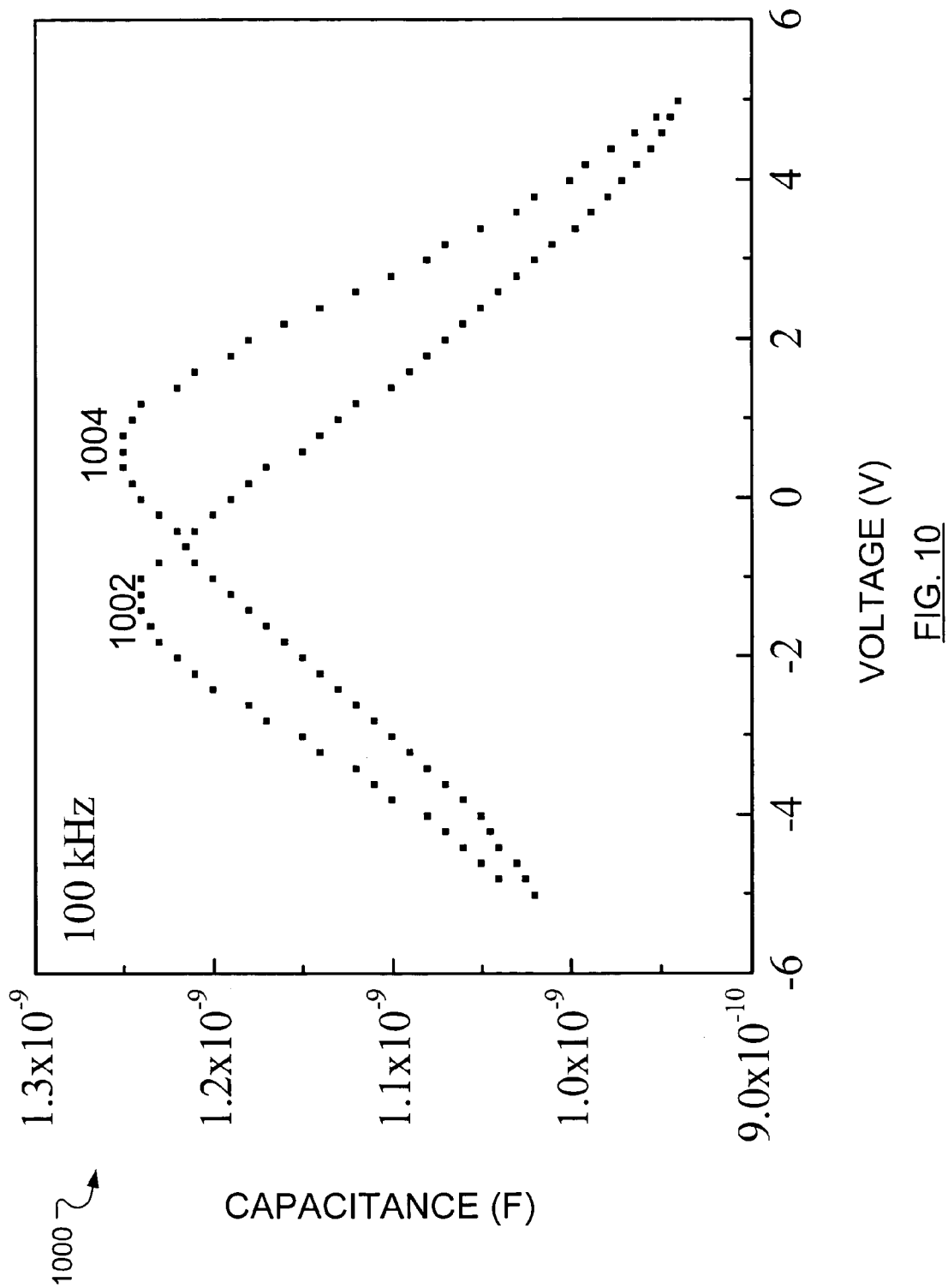
FIG. 10 illustrates capacitance-voltage (C-V) characteristic behavior for PZT-based ferroelectric capacitors including a PLT/PZT/PLT ferroelectric capacitor formed according to an embodiment of the present invention.

The ferroelectric hysteresis behavior of the PLT/PZT/PLT ferroelectric capacitor formed according to an embodiment of the present invention with a thickness around 250 nm may also be considered in light of a Capacitance-Voltage (C-V) characteristic 1000, which is illustrated in FIG. 10. The C-V characteristic 1000 may be recorded as an applied voltage is swept from a positive to negative bias and back again at 100 kHz. Two peaks (1002, 1004) are clearly seen in FIG. 10 as the capacitance of the PLT/PZT/PLT ferroelectric capacitor ranges from 0.9 nF to 1.3 nF responsive to an applied bias that ranges from −5 V to +5 V. The presence of two peaks is generally attributed to the ferroelectric domain switching (S. B. Desu and D. P. Vijay, Mater. Sci. Eng., B 32, vol. 75, 1995). The two peaks 1002, 1004 are not perfectly symmetric, although the peak capacitance and the corresponding voltages are nearly equal. The reason for these differences may be the nature of the interfaces in the sandwich structure (see T. L. Ren, L. T. Zhang, L. T. Liu and Z. J. Li, "Electrical properties of a silicon-based PT/PZT/PT sandwich structure," J. Phys. D: Appl. Phys., Volume 33, Number 15, 7 August 2000, L77).

Figure 11:
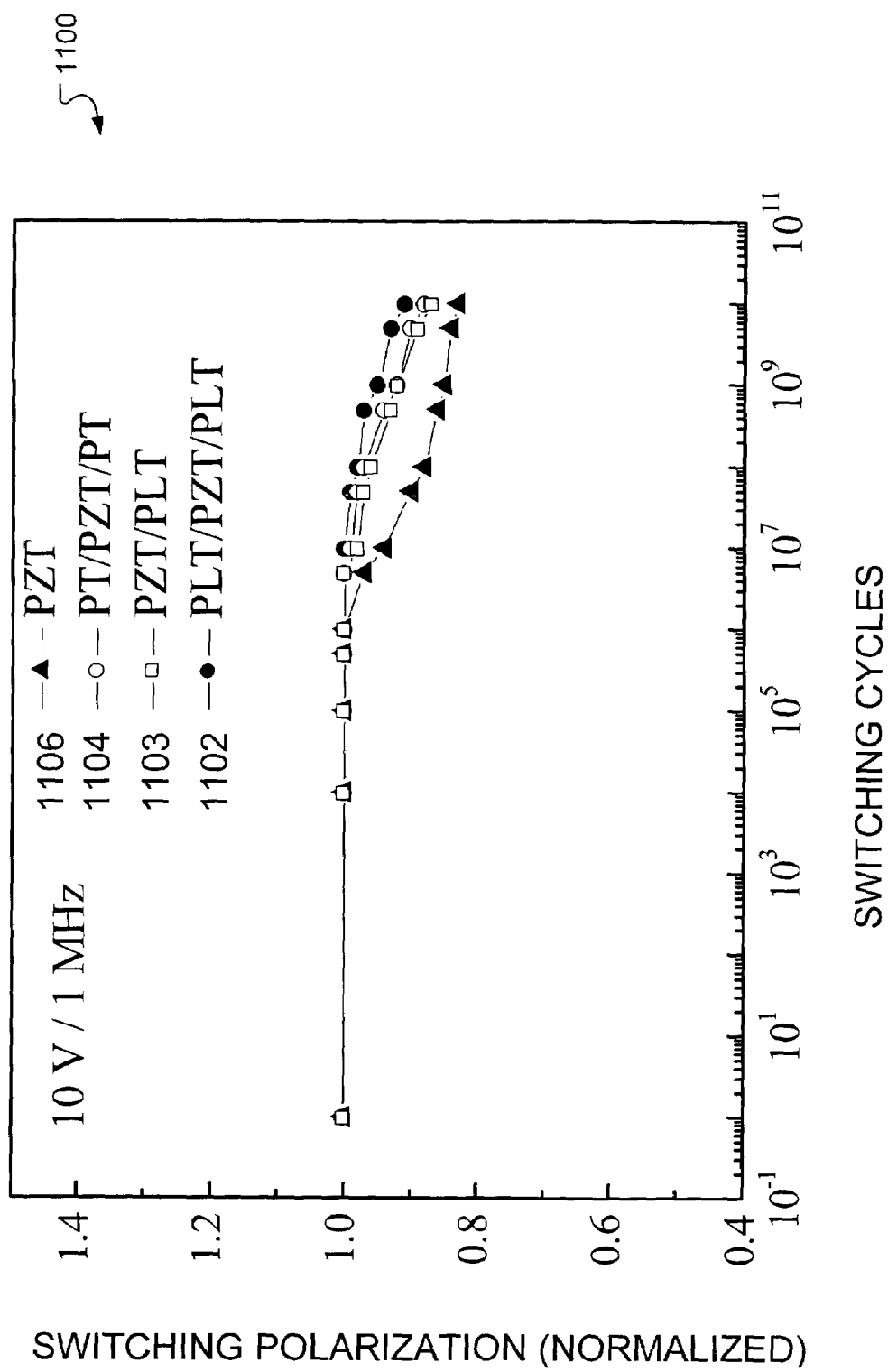
FIG. 11 illustrates curves characterizing loss of switchable polarization with repeated polarization reversals known as ferroelectric fatigue for PZT-based ferroelectric capacitors including a PLT/PZT/PLT ferroelectric capacitor formed according to an embodiment of the present invention.

A curve 1102 characterizing a loss of switchable polarization with repeated polarization reversals known as ferroelectric fatigue is shown for the PLT/PZT/PLT film in FIG. 11. For comparison, fatigue characteristic curves of PLT/PZT 1103, PT/PZT/PT 1104 and PZT-only 1106 ferroelectric capacitors are also illustrated. All four curves 1102, 1103, 1104, 1106 exhibit similar fatigue properties up to $10^6$ cycles, however the fatigue characteristic curve 1106 for the PZT-only ferroelectric capacitor shows an abrupt polarization decrease between $10^7$ to $10^{10}$ cycles. It may be shown that a PZT-only ferroelectric capacitor may have approximately 17% of polarization loss at $10^{10}$ cycles. In comparison, the PLT/PZT, PT/PZT/PT and PLT/PZT/PLT multilayer structures show better fatigue characteristics in terms of reduced loss of switchable polarization. At $10^{10}$ cycles, polarization loss of about 9% is observed in the PLT/PZT/PLT structures (curve 1102) whereas PT/PZT/PT display a 12% loss (curve 1104).

Figure 12:
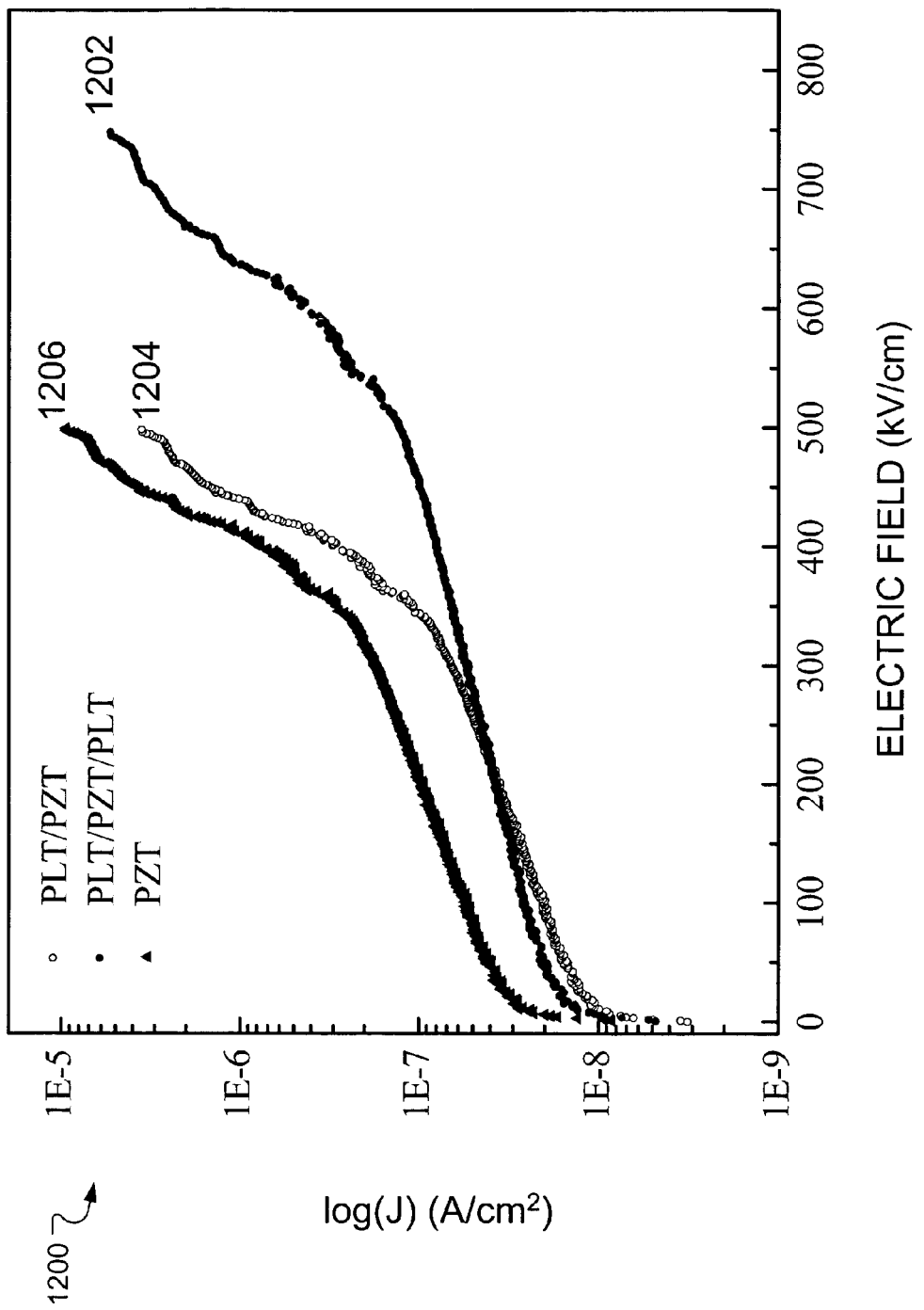
FIG. 12 illustrates leakage current density versus electric field characteristics for PZT-based ferroelectric capacitors including a PLT/PZT/PLT ferroelectric capacitor formed according to an embodiment of the present invention.

FIG. 12 depicts the leakage current density (J) versus electric field (E) characteristics for PLT/PZT/PLT (1202), PT/PZT/PT (1204) and PZT-only (1206) ferroelectric capacitors. Each of the three J-E characteristics 1202, 1204, 1206 demonstrate three distinct regimes of leakage current transport. At very low electric fields, i.e., below 15 kV/cm, the current density increases almost linearly with voltage, i.e., the films display nearly Ohmic behavior. This leakage current is likely to be due to a hopping conduction mechanism in a low electric field, because thermal excitation of trapped electrons from one trap site to another dominates transport in the films S. Ezhilvalavan and T. Y. Tseng, "Conduction mechanisms in amorphous and crystalline $Ta_2O_5$ thin films," J. Appl. Phys., Vol. 83, issue 9, pp. 4797, May 1, 1998 and S. Ezhilvalavan, Victor Samper, T. W. Seng, J. M. Xue, J. Wang, J. Appl. Phys., Vol. 96, issue 4, pp. 2181, Aug. 15, 2004. At intermediate electric fields, i.e., 50 to 350 kV/cm, the current density increases proportionally to the square root of the applied electric field. At higher electric fields, i.e., greater than 350 kV/cm, the current density increases rapidly for a slight increase in the applied electric field, which suggests that the leakage current density is limited by a different conduction mechanism from that in the low electric field regime.

The PLT/PZT/PLT (1202) and PT/PZT/PT (1204) J-E characteristics each exhibit a leakage current density of around $3.5 \times 10^{-8}$ A/cm² at 200 kV/cm, whereas the PZT-only J-E characteristic exhibits a leakage current density of around $10^{-7}$ A/cm² for the same electric field. At higher electric fields, say greater than 400 kV/cm, the PLT/PZT/PLT J-E characteristic 1202 has a much lower leakage current density value than the values for either the PT/PZT/PT J-E characteristic 1204 or the PZT-only J-E characteristics 1206, indicating that the PLT/PZT/PLT structure has better electrical stability than the PT/PZT/PT and PZT-only ferroelectric capacitor. The improved J-E characteristics of the PLT/PZT/PLT structure could be attributed to the formation of a Pt/PLT interface between the second conductive film 308 and the bottom PLT layer 410A and a Pt/PLT interface between the top PLT layer 410B and the third conductive film 514. The Pt/PLT interface may be seen to help to lower the densities of oxygen vacancies typically formed at Pt/PZT interfaces, responsible for increasing the leakage current in PZT-only ferroelectric capacitor. These oxygen vacancies are generally believed to be responsible for the fatigue behavior in PZT grown on Pt (P. K. Larsen, G. J. M. Dormans, D. J. Taylor and P. J. van Veldhoven, "Ferroelectric properties and fatigue of $PbZr_{0.51}Ti_{0.49}O_3$ thin films of varying thickness: Blocking layer model," J. Appl. Phys., Vol. 76, Issue 4, pp. 2405, Aug. 15, 1994 and J. F. Scott and C. A. Araujo, Science (Washington, D.C., US), 246, 1400, 1989).

Figure 13:
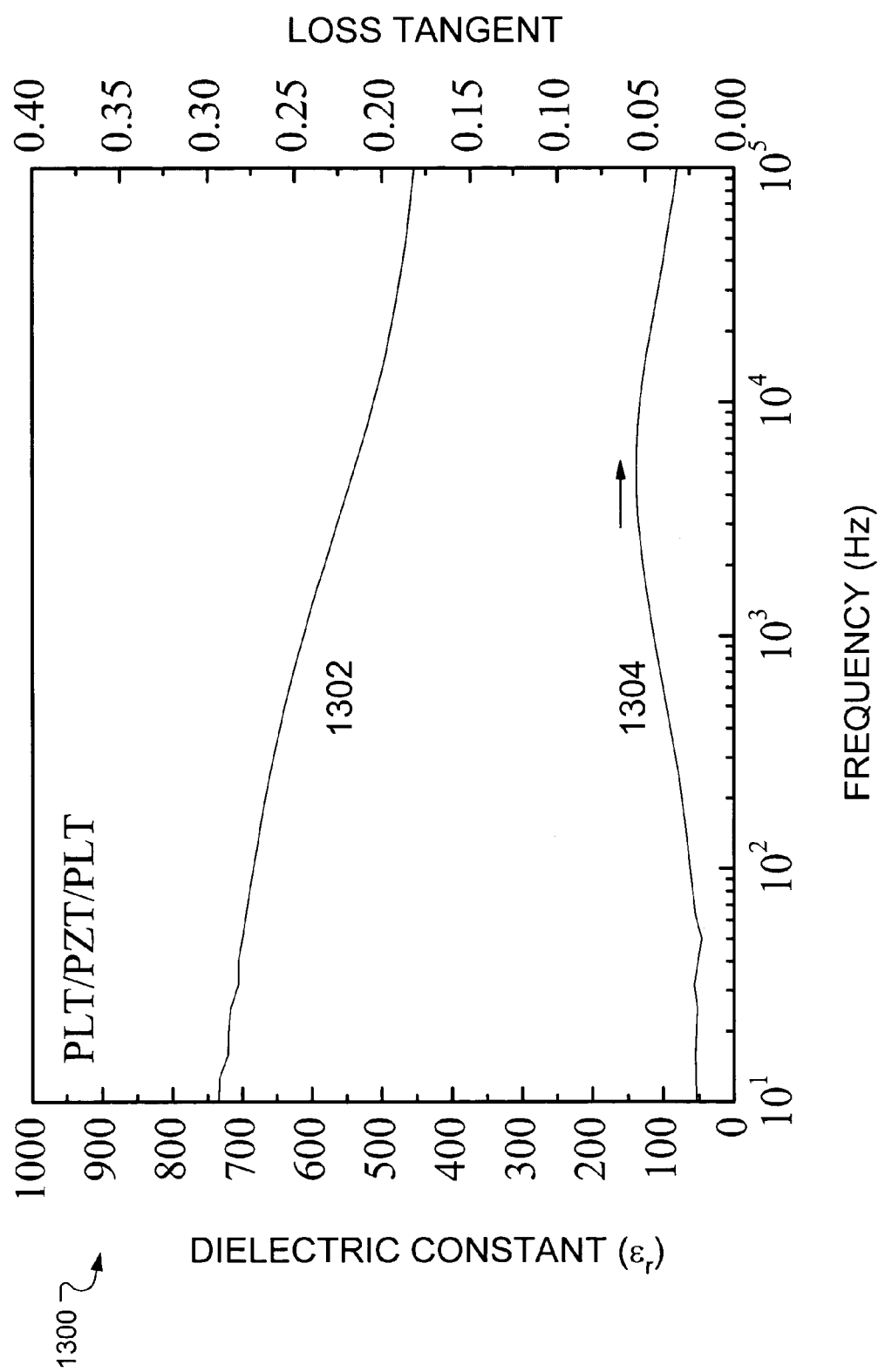
FIG. 13 illustrates a relative dielectric constant and loss tangent as a function of frequency for a PLT/PZT/PLT ferroelectric capacitor formed according to an embodiment of the present invention.

FIG. 13 shows a relative dielectric constant and the loss tangent as a function of frequency from 100 Hz to 100 kHz at room temperature for the PLT/PZT/PLT film annealed at 700° C. for one hour. A plot 1302 of the dielectric constant decreases steadily from around 735 to around 450 with increasing frequency from 100 Hz to 100 kHz. A plot 1304 of the loss tangent varies from 0.04 to 0.06 in the same frequency range.

The plots 1302, 1304 demonstrate that, by introducing PLT layers 410A, 410B, which have a lower dielectric constant than the PZT layer 412, above and below the PZT layer 412, the electrical properties of resulting structure can be superior to a PT/PZT/PT ferroelectric capacitor or a PZT-only ferroelectric capacitor. The electrical properties, such as the coercive field and leakage current density, can be substantially reduced with better resistance to fatigue and the remnant polarization can be increased. These benefits may be attributed to the effect of the PLT layer, which can offer nucleation sites and reduce the activation energy for the crystallization of PZT layers forming stoichiometric perovskite structure at lower processing temperature (around 700° C.). In addition, the PLT layer 410 helps to attain a better interface between the PZT layer 412 and the associated electrodes 308, 514, thereby leading to absorption of oxygen vacancies or other point defects from the PZT layer 412 (O. Auciello, J. F. Scott and R. Ramesh, "The Physics of Ferroelectric Memories," Phys. Today, vol. 51, no. 22, July 1998 and F. Yan, Y. Wang, H. L. W. Chan and C. L. Choy, "Ferroelectric properties of $(Ba_{0.5}Sr_{0.5})TiO_3/Pb(Zr_{0.52}Ti_{0.48})O_3/(Ba_{0.5}Sr_{0.5})TiO_3$ thin films with platinum electrodes," Appl. Phys. Lett., vol. 82, Issue 24, pp. 4325 Jun. 16, 2003).

It has been reported that for a PZT layer of thickness ranging from 100 to 500 nm, the coercive field ranges from 30-200 kV/cm, the leakage current ranges from about $1 \times 10^{-6}$ to about $1 \times 10^{-8}$ A/cm² and the remnant polarization ranges from about 3-40 µC/cm² (see U.S. Pat. No. 6,507,060 to Ren et al., Y. Sakashita, H. Segawaa, K. Tominaga and M. Okada, "Dependence of electrical properties on film thickness in $Pb(Zr_xTi_{1-x})O_3$ thin films produced by metalorganic chemical vapor deposition," J. Appl. Phys. Vol. 73, Issue 11, pp. 7857, Jun. 1, 1993 and D. L. Polla and L. F. Francis, "Processing and characterization of piezoelectric materials and integration into microelectromechanical systems," Annu. Rev. Mater. Sci., Vol. 28 (1998), pp. 563). For comparison, Ren et al. reported that a coercive field of 24 kV/cm, a leakage current density of $5 \times 10^{-9}$ A/cm² and a remnant polarization of 17 µC/cm² for PT/PZT/PT structures, with thickness of the layers 20/200-500/20 nm. However, Ren et al. have not studied the ferroelectric characteristics of the thick (greater than 500 nm) PT/PZT/PT structures. Therefore present studies envisage that both thin (around 250 nm) and thick (around 1 µm) ferroelectric capacitors with the PLT/PZT/PLT sandwich structure will exhibit better ferroelectric and leakage current characteristics in comparison to PT/PZT/PT sandwich structures and exhibit more reliable fatigue characteristics.

Wet chemical patterning of PLT/PZT/PLT sandwich structures may be performed using a solvent solution (HCl+ HNO$_3$+HF+CH$_3$COOH+H$_2$O; 5:5:5:10:75) to study the chemical stability of the PLT/PZT/PLT sandwich structures. Wet chemical etching is an alternative approach for patterning thick (i.e., greater than 1 µm) PZT films for micro electro mechanical systems (MEMS). The etching rate of such a solvent solution may be determined to be about 200 nm/min. Photo resist coatings may be used to mask circular PZT patterns of diameter 2 mm.

Results indicate that PLT/PZT/PLT sandwich structures have good chemical stability with reliable ferroelectric characteristics whereas the PT/PZT/PT sandwich structures exhibit poor hysteresis loops and the leakage current density is increased after chemical etching.

Other modifications will be apparent to those skilled in the art and, therefore, the invention is defined in the claims.

We claim:

1. A ferroelectric structure comprising:
    a first Lanthanum doped Lead Titanate layer; and
    a Lead Zirconate Titanate layer formed over said Lanthanum doped Lead Titanate layer;
    a second Lanthanum doped Lead Titanate layer formed over said Lead Zirconate Titanate layer.

2. The ferroelectric structure of claim 1 wherein a composition of said Lead Zirconate Titanate layer has a form described by $Pb_x(Zr_yTi_{1-y})O_3$ wherein x=0.9-1.2 and y=0.4-0.6.

3. The ferroelectric structure of claim 1, wherein said Lead Zirconate Titanate layer is described by $PbZr_{0.52}Ti_{0.48}O_3$.

4. The ferroelectric structure of claim 1 wherein a thickness of said first Lanthanum doped Lead Titanate layer is around 10 to 100 nanometers and wherein said thickness of said first Lanthanum doped Lead Titanate layer is less than 20% of a thickness of said Lead Zirconate Titanate layer.

5. A method for fabricating the ferroelectric structure of claim 1, comprising:
    forming said first Lanthanum doped Lead Titanate layer;
    forming said Lead Zirconate Titanate layer over said first Lanthanum doped Lead Titanate layer; and
    forming said second Lanthanum doped Lead Titanate layer over said Lead Zirconate Titanate layer.

6. The method of claim 5 wherein said forming said Lead Zirconate Titanate layer comprises: preparing a Lead Zirconate Titanate precursor solution by a sol-gel process; and depositing said Lead Zirconate Titanate layer by spin coating said Lead Zirconate Titanate precursor solution over said first Lanthanum doped Lead Titanate layer.

7. The method of claim 6 wherein said spin coating is performed at around 500 to 5,000 revolutions per minute for around 10 to 100 seconds.

8. The method of claim 6 further comprising adding a lead source to said Lead Zirconate Titanate precursor solution until said Lead Zirconate Titanate precursor solution has around 5 to 20 mol % excess lead.

9. The method of claim 8 wherein said lead source is lead acetate trihydrate.

10. The method of claim 6 further comprising, subsequent to depositing said Lead Zirconate Titanate layer over said first Lanthanum doped Lead Titanate, annealing at around 600° C. to 800° C. for greater than 30 minutes.

11. The method of claim 5 wherein said first Lead Zirconate Titanate layer is described by $PbZr_{0.52}Ti_{0.48}O_3$.

12. The method of claim 5 wherein said forming said first Lanthanum doped Lead Titanate layer comprises: preparing a Lanthanum doped Lead Titanate precursor solution by a sol-gel process; and depositing said Lanthanum doped Lead Titanate layer by spin coating said Lanthanum doped Lead Titanate precursor solution over a conductive film.

13. The method of claim 12 wherein said spin coating is performed at around 500 to 5,000 revolutions per minute for around 10 to 100 seconds.

14. The method of claim 12 further comprising adding a lead source to said Lanthanum doped Lead Titanate precursor solution until said Lanthanum doped Lead Titanate precursor solution has around 5 to 20 mol % excess lead.

15. A structure for a PLT/PZT ferroelectric capacitor, said structure comprising: a substrate; a dielectric layer formed over said substrate; a first conductive metal film formed over said dielectric layer; a second conductive metal film formed over said first conductive metal film; a Lanthanum doped Lead Titanate layer formed over said second conductive metal film; a Lead Zirconate Titanate layer formed over said Lanthanum doped Lead Titanate layer; and a third conductive metal film formed over said Lead Zirconate Titanate layer.

16. The structure of claim 15 wherein said substrate comprises semiconductor material.

17. The structure of claim 15 wherein said substrate comprises ceramic material.

18. The structure of claim 15 wherein said first conductive metal film comprises a titanium material and is around 10-100 nanometers thick.

19. The structure of claim 15 wherein said second conductive metal film comprises platinum material and is around 10-1000 nanometers thick.

20. The structure of claim 15 wherein said third conductive metal film comprises platinum material and is around 10-1000 nanometers thick.

21. The structure of claim 15 further comprising a fourth conductive metal film formed over said third conductive metal film.

22. The structure of claim 21 wherein said third conductive metal film comprises titanium material at around 10-100 nanometers thick and said fourth conductive film comprises platinum material at around 10-1000 nanometers thick.

23. A structure for a PLT/PZT/PLT ferroelectric capacitor, said structure comprising: a substrate; a dielectric layer formed over said substrate; a first conductive metal film formed over said dielectric layer; a second conductive metal film formed over said first conductive metal film; a first Lanthanum doped Lead Titanate layer formed over said second conductive metal film; a Lead Zirconate Titanate layer formed over said first Lanthanum doped Lead Titanate layer; a second Lanthanum doped Lead Titanate layer formed over said Lead Zirconate Titanate layer; and a third conductive metal film formed over said second Lanthanum doped Lead Titanate layer.

24. The structure of claim 23 further comprising a fourth conductive metal film formed over said third conductive metal film.

25. The structure of claim 23 wherein said substrate is a semiconductor.

26. The structure of claim 23 wherein said substrate is a ceramic.

27. A method for fabricating a PLT/PZT ferroelectric capacitor on a substrate, said method comprising: forming a dielectric layer over said substrate; forming a first conductive film over said dielectric layer; forming a second conductive film over said first conductive film; forming a Lanthanum doped Lead Titanate layer over said second conductive film; forming a Lead Zirconate Titanate layer over said Lanthanum doped Lead Titanate layer; forming a third conductive film over said Lead Zirconate Titanate layer.

28. The method of claim 27 further comprising forming a fourth conductive film over said third conductive film.

29. A method for fabricating a PLT/PZT/PLT ferroelectric capacitor on a substrate, said method comprising: forming a dielectric layer over said substrate; forming a first conductive film over said dielectric layer; forming a second conductive film over said first conductive film; forming a first Lanthanum doped Lead Titanate layer over said second conductive film; forming a Lead Zirconate Titanate layer over said first Lanthanum doped Lead Titanate layer; forming a second Lanthanum doped Lead Titanate layer over said Lead Zirconate Titanate layer; and forming a third conductive film over said second Lanthanum doped Lead Titanate layer.

30. The method of claim 29 further comprising forming a fourth conductive film over said third conductive film.

* * * * *